United States Patent
Jung

(10) Patent No.: US 10,943,634 B2
(45) Date of Patent: Mar. 9, 2021

(54) READ LATENCY IMPROVEMENT METHOD AND MEMORY SYSTEM THEREOF

(71) Applicant: SK hynix Inc., Gyeonggi-do (KR)

(72) Inventor: Hui-Sug Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/517,232

(22) Filed: Jul. 19, 2019

(65) Prior Publication Data

US 2020/0176045 A1 Jun. 4, 2020

(30) Foreign Application Priority Data

Nov. 30, 2018 (KR) .................. 10-2018-0151629

(51) Int. Cl.
| | | |
|---|---|---|
| *G11C 11/22* | (2006.01) | |
| *G06F 11/10* | (2006.01) | |
| *G11C 29/50* | (2006.01) | |
| *G06F 11/07* | (2006.01) | |

(52) U.S. Cl.
CPC ........ *G11C 11/2273* (2013.01); *G06F 11/076* (2013.01); *G06F 11/1008* (2013.01); *G11C 29/50004* (2013.01); *G06F 2201/81* (2013.01)

(58) Field of Classification Search
CPC .......... G11C 11/2273; G11C 29/50004; G11C 11/5642; G06F 11/1008; G06F 2201/81; G06F 11/076
See application file for complete search history.

(56) References Cited

U.S. PATENT DOCUMENTS

| | | | | |
|---|---|---|---|---|
| 9,069,659 B1* | 6/2015 | Sabbag | ............... | G11C 11/5642 |
| 9,870,830 B1* | 1/2018 | Jeon | .................... | G11C 11/5642 |
| 2010/0091535 A1* | 4/2010 | Sommer | ................ | G11C 16/28 |
| | | | | 365/45 |
| 2014/0063971 A1* | 3/2014 | Lee | ...................... | G11C 16/349 |
| | | | | 365/185.22 |
| 2015/0178156 A1* | 6/2015 | Shin | .................... | G06F 11/1048 |
| | | | | 714/721 |
| 2016/0179615 A1* | 6/2016 | Lee | ..................... | G06F 11/1048 |
| | | | | 714/764 |
| 2016/0378596 A1* | 12/2016 | Kim | .................... | G06F 11/1068 |
| | | | | 714/755 |
| 2017/0148525 A1* | 5/2017 | Kathawala | ............ | G06F 11/079 |

FOREIGN PATENT DOCUMENTS

| | | |
|---|---|---|
| KR | 10-2017-0062254 | 6/2017 |
| KR | 10-1835605 | 3/2018 |

\* cited by examiner

*Primary Examiner* — Khamdan N. Alrobaie
(74) *Attorney, Agent, or Firm* — IP & T Group LLP

(57) ABSTRACT

A memory system includes a memory device, and a controller suitable for correcting errors included in request data read through a first read operation performed by the memory device in response to a read command provided from a host, and providing corrected data to the host, wherein the controller includes a first read processor suitable for performing the first read operation, a second read processor suitable for performing a second read operation, a third read processor suitable for performing a third read operation, and a fourth read processor suitable for detecting an optimal read voltage through an e-boost operation and performing a fourth read operation.

20 Claims, 12 Drawing Sheets

<IDEAL>

READ LATENCY IMPROVEMENT METHOD AND MEMORY SYSTEM THEREOF

CROSS-REFERENCE TO RELATED APPLICATIONS

The present application claims priority under 35 U.S.C. § 119(a) to Korean Patent Application No. 10-2018-0151629, filed on Nov. 30, 2018, the disclosure of which is incorporated herein by reference in its entirety.

BACKGROUND

1. Field

Various exemplary embodiments of the present invention relate to a data processing system, and more particularly, to a memory system capable of efficiently performing a read operation, and an operating method thereof.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts, as compared with a hard disk device. Examples of memory systems having such advantages include universal serial bus (USB) memory devices, memory cards having various interfaces, and solid state drives (SSDs).

SUMMARY

Various embodiments of the present invention are directed to a memory system capable of performing a read operation by skipping a read retry operation when the number of error bits included in read data is greater than or equal to a predetermined threshold value.

In accordance with an embodiment of the present invention, a memory system includes: a memory device; and a controller suitable for controlling the memory device to perform a read operation on request data in response to a read command from a host, receiving the request data corresponding to the read operation from the memory device, correcting errors of the request data to generate corrected data and providing the corrected data to the host, wherein the controller includes: a first read processor suitable for performing a first read operation of reading, as first data, the request data in response to the read command; a second read processor suitable for performing a second read operation of reading, as second data, the request data again using a voltage stored in a read history table, when the number of error bits of the first data is greater than or equal to a first threshold value and less than a second threshold value; a third read processor suitable for performing a third read operation of reading, as third data, the request data again using voltages stored in a predetermined table, when the number of error bits of the second data is equal to or greater than the first threshold value; and a fourth read processor suitable for detecting an optimal read voltage through an e-boost operation and performing a fourth read operation of reading, as fourth data, the request data again using the optimal read voltage, when the number of error bits of the third data is equal to or greater than the first threshold value, wherein the fourth read processor performs the fourth read operation when the number of error bits of the first data is greater than or equal to the second threshold value.

In accordance with an embodiment of the present invention, an operating method of a memory system includes: a first read step of reading, as first data, request data in response to a read command provided from a host; a second read step of reading, as second data, the request data again using a voltage stored in a read history table, when the number of error bits of the first data is greater than or equal to a first threshold value and less than a second threshold value; a third read step of reading, as third data, the request data again using voltages stored in a predetermined table, when the number of error bits of the second data is greater than or equal to the first threshold value; and a fourth read step of detecting an optimal read voltage through an e-boost operation and reading, as fourth data, the request data again using the optimal read voltage, when the number of error bits of the third data is greater than or equal to the first threshold value, wherein the fourth read step is performed when the number of error bits of the first data is greater than or equal to the second threshold value.

In accordance with an embodiment of the present invention, a memory system includes: a memory device including a plurality of memory blocks; and a controller suitable for receiving a read command from a host and controlling the memory device to perform read operations in response to a read command, wherein the controller is suitable for: reading request data, as first read data, from the memory block, using a read voltage, in response to the read command; determining whether the number of error bits of the first read data is greater than or equal to a first threshold value; when it is determined that the number of error bits of the first read data is greater than or equal to the first threshold value, determining whether the number of error bits of the first read data is greater than or equal to a second threshold value; when it is determined that the number of error bits of the first read data is less than the second threshold value, reading the request data, as second read data, from the memory block, using the read voltage; and when it is determined that the number of error bits of the first read data is greater than or equal to the second threshold value, reading the request data, as additional read data, from the memory block using an optimal read voltage generated through an e-boost operation.

DETAILED DESCRIPTION

Figure 1:
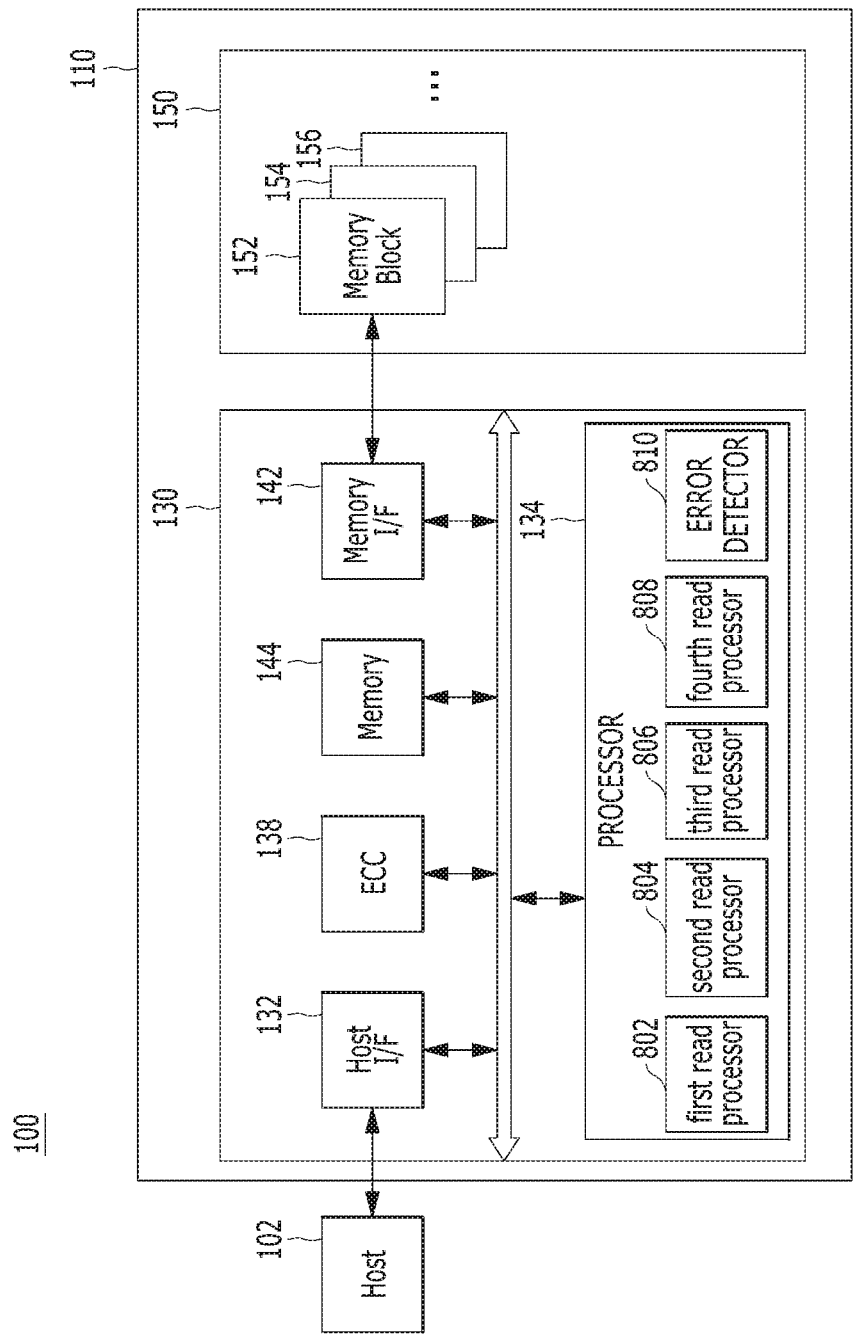
FIG. 1 is a block diagram illustrating a data processing system including a memory system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include any of a variety of portable electronic devices such as a mobile phone, a MP3 player and a laptop computer, or any of a variety of non-portable electronic devices such as a desktop computer, a game machine, a television (TV) and a projector.

The host 102 may include at least one operating system (OS) or a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request. The OS may manage and control overall functions and operations of the host 102. The OS may support an operation between the host 102 and a user using the data processing system 100 or the memory system 110.

The memory system 110 may operate or perform a specific function or operation in response to a request from the host 102. Particularly, the memory system 110 may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of the memory system 110 include a solid state drive (SSD), a multi-media card (MMC) and an embedded MMC (eMMC).

The memory system 110 may include various types of storage devices. Non-limiting examples of such storage devices include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a controller 130 and a memory device 150.

The controller 130 and the memory device 150 may be integrated into a single semiconductor device, which may be included in any of the various types of memory systems as described above. For example, the controller 130 and the memory device 150 may be integrated as a single semiconductor device to constitute an SSD, a personal computer memory card international association (PCMCIA) card, a secure digital (SD) card including a mini-SD, a micro-SD and a SDHC, and a universal flash storage (UFS) device. The memory system 110 may be configured as a part of a computer, a smart phone, a portable game player, or one of various components configuring a computing system.

The memory device 150 may be a nonvolatile memory device which may retain stored data even though power is not supplied. The memory device 150 may store data provided from the host 102 through a write operation, and output data stored therein to the host 102 through a read operation. In an embodiment, the memory device 150 may include a plurality of memory dies (not shown), and each memory die may include a plurality of planes (not shown). Each plane may include a plurality of memory blocks 152 to 156. Each of the plurality of memory blocks 152 to 156 may include a plurality of pages, each of which may include a plurality of memory cells coupled to a word line. In an embodiment, the memory device 150 may be a flash memory having a 3-dimensional (3D) stack structure.

The structure of the memory device 150 and the 3D stack structure of the memory device 150 will be described in detail below with reference to FIGS. 2 to 4.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

More specifically, the controller 130 may include a host interface (I/F) 132, a processor 134, an error correction code (ECC) circuit 138, a memory interface 142, and a memory 144, all operatively coupled or engaged via an internal bus. As will be described below with reference to FIG. 8, the processor 134 may include a first read processor 802, a second read processor 804, a third read processor 806, a fourth read processor 808, and an error detector 810. The first read processor 802, second read processor 804, third read processor 806, fourth read processor 808 include all circuits, systems, software, firmware and devices necessary for their respective operations and functions.

The host interface 132 may process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (DATA), enhanced small disk interface (ESDI) and integrated drive electronics (IDE). The host interface 132 may be driven via a firmware, that is, a host interface layer (HIL) for exchanging data with the host 102.

The ECC circuit 138 may correct error bits of data to be processed by the memory device 150 and may include an ECC encoder and an ECC decoder. The ECC encoder may perform error correction encoding on data to be programmed into the memory device 150 to generate data to which a parity bit is added. The data including the parity bit may be stored in the memory device 150. The ECC decoder may detect and correct an error contained in the data read from the memory device 150. The ECC circuit 138 may perform error correction through a coded modulation such as a Low Density Parity Check (LDDC) code, a Bose-Chaudhri-Hocquenghem (BCH) code, a turbo code, a Reed-Solomon code, a convolution code, a Recursive Systematic Code (RSC), a Trellis-Coded Modulation (TCM) and a Block coded modulation (BCM). However, the ECC circuit 138 is not limited to these error correction techniques. As such, the ECC circuit 138 may include any and all circuits, modules, systems or devices for performing suitable error correction.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130. That is, the memory 144 may store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. FIG. 1 shows that the memory 144 is disposed within the controller 130. Alternatively, the memory 144 may be an external volatile memory having a memory interface for transferring data between the memory 144 and the controller 130.

As described above, the memory 144 may include a program memory, a data memory, a write buffer/cache, a read buffer/cache, a data buffer/cache and a map buffer/cache. The memory 144 may store some data required to perform data write and read operations between the host 102 and the memory device 150 and other data required for the controller 130 and the memory device 150 to perform these operations.

The processor 134 may control overall operations of the memory system 110. The processor 134 may use firmware to control the overall operations of the memory system 110. The firmware may be referred to as flash translation layer (FTL). The processor 134 may be implemented with a microprocessor or a central processing unit (CPU).

For example, the controller 130 may perform an operation requested by the host 102 in the memory device 150 through the processor 134. Also, the controller 130 may perform a background operation on the memory device 150 through the processor 134. The background operation performed on the memory device 150 may include a garbage collection (GC) operation, a wear-leveling (WL) operation, a map flush operation and a bad block management operation. The garbage collection operation may include an operation of copying and processing data stored in some memory blocks among the memory blocks 152 to 156 of the memory device 150 into other memory blocks. The wear-leveling operation may include an operation of performing swapping between the memory blocks 152 to 156 or between the data of the memory blocks 152 to 156. The map flush operation may include an operation of storing the map data stored in the controller 130 in the memory blocks 152 to 156. The bad block management operation may include an operation of managing bad blocks of the memory device 150. That is, the bad block management operation may include an operation of detecting and processing bad blocks among the memory blocks 152 to 156 in the memory device 150.

The memory device of the memory system in accordance with an embodiment of the present invention is described in detail with reference to FIGS. 2 to 4.

Figure 2:
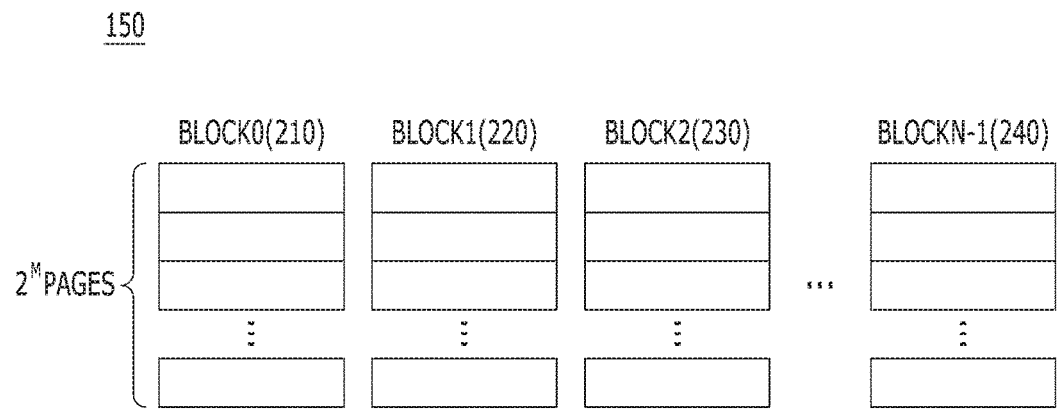
FIG. 2 is a schematic diagram illustrating a memory device employed in the memory system shown in FIG. 1.

FIG. 2 is a schematic diagram illustrating the memory device 150 of FIG. 1. FIG. 3 is a circuit diagram illustrating an exemplary configuration of a memory cell array of a memory block 330 in the memory device 150 of FIG. 1. FIG.

4 is a schematic diagram illustrating an exemplary three-dimensional (3D) structure of the memory device 150 of FIG. 1.

Referring to FIG. 2, the memory device 150 may include a plurality of memory blocks BLOCK0 to BLOCKN-1, where N is an integer greater than 1. Each of the blocks BLOCK0 to BLOCKN-1 may include a plurality of pages, for example, $2^M$ or M pages, where M is an integer greater than 1. The number of each of the plurality of pages may vary according to circuit design. Each of the pages may include a plurality of memory cells that are coupled to a plurality of word lines WL.

Also, memory cells in the respective memory blocks BLOCK0 to BLOCKN-1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages which are embodied by memory cells, each storing one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space, that is, higher integration density, than the SLC memory blocks. In another embodiment, the memory device 150 may include a plurality of triple level cell (TLC) memory blocks. In yet another embodiment, the memory device 150 may include a plurality of quadruple level cell (QLC) memory blocks. The TLC memory blocks may include a plurality of pages which are embodied by memory cells each capable of storing 3-bit data. The QLC memory blocks may include a plurality of pages which are embodied by memory cells each capable of storing 4-bit data.

Instead of a nonvolatile memory, the memory device 150 may be implemented by any one of a phase change random access memory (PCRAM), a resistive random access memory (RRAM or ReRAM), a ferroelectrics random access memory (FRAM), and a spin transfer torque magnetic random access memory (STT-RAM or STT-MRAM).

The memory blocks 210, 220, 230, 240 may store the data received from the host 102 through a program operation, and may transfer data stored therein to the host 102 through a read operation.

Figure 3:
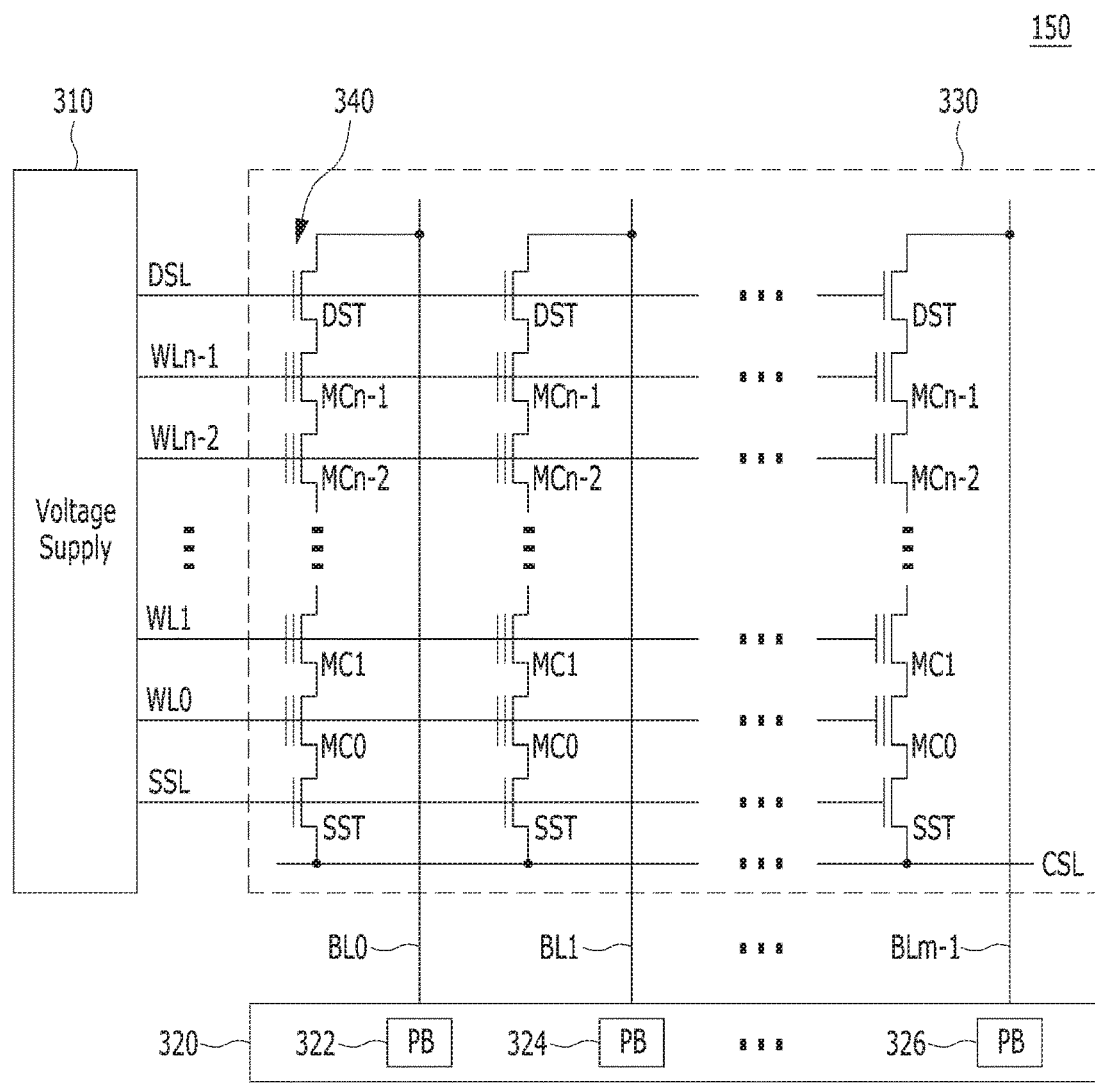
FIG. 3 is a circuit diagram illustrating a memory cell array of a memory block in the memory device shown in FIG. 1.
Figure 4:
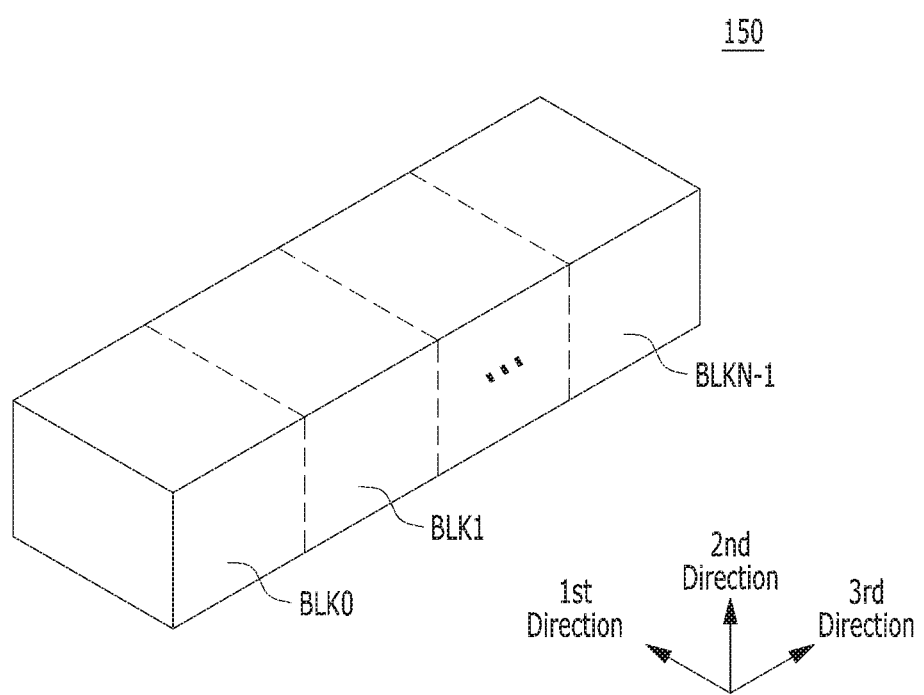
FIG. 4 is a block diagram illustrating a memory device of a memory system in accordance with an embodiment of the present invention.

Referring to FIG. 3, the memory block 330 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the present disclosure is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read and write (read/write) circuit 320 which is controlled by the control circuit. During a verification/normal read operation, the read/write circuit 320 may operate as a sense amplifier for reading (i.e., sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive data to be stored into the memory cell array from a buffer (not illustrated), and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1. Herein, FIG. 4 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may include structures of a three-dimensional structure that are extended in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330 among the memory blocks 152, 154 and 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS.

Also, a string selection transistor SST of each NAND string NS may be coupled to a corresponding bit line BL, and a ground selection transistor GST of each NAND string NS may be coupled to a common source line CSL. Herein, memory cells MC may be provided between the string selection transistor SST and the ground selection transistor GST of each NAND string NS. Namely, a plurality of memory cells may be realized in each memory block 330 of the memory blocks 152, 154 and 156 of the memory device 150.

As described above with reference to FIG. 2, the flash memory may determine a state of data which can be stored in each of the memory cells, according to the number of bits stored in each of the memory cells. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. The MLC is advantageous for high integration. However, as the number of bits programmed in each memory cell increase, the reliability decreases and the read failure rate increases.

For example, when k bits are to be programmed in a memory cell, one of $2^k$ threshold voltages is formed in the memory cell. Due to the minute differences between the electrical characteristics of memory cells, the threshold voltages of memory cells programmed for the same data form threshold voltage distributions. The threshold voltage distributions correspond to $2^k$ data values representing k-bit information, respectively.

However, a voltage window available for the threshold voltage distributions is finite. Therefore, as the value k increases, the distance between the threshold voltage distributions decreases and the neighboring threshold voltage distributions overlap each other. As the neighboring threshold voltage distributions overlap each other, read data may include several or several tens of error bits.

Figure 5:
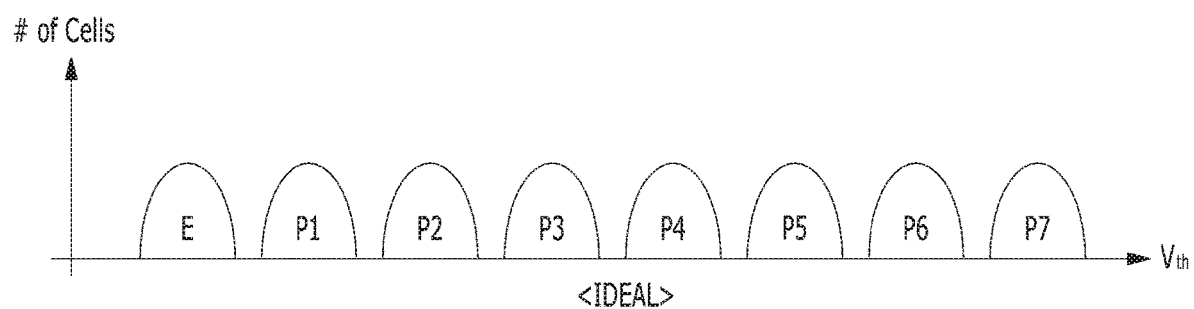
FIG. 5 is a threshold voltage distribution schematically illustrating program and erase states of a 3-bit multi-level cell (MLC) non-volatile memory device.

FIG. 5 is a threshold voltage distribution illustrating program and erase states of a 3-bit multi-level cell (MLC) non-volatile memory device.

Figure 6:
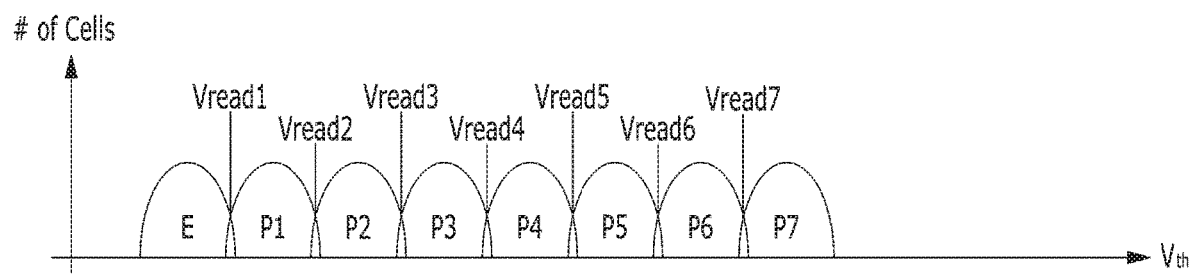
FIG. 6 is a threshold voltage distribution schematically illustrating program and erase states due to characteristic deterioration of a 3-bit multi-level cell (MLC) non-volatile memory device.

FIG. 6 is a threshold voltage distribution illustrating program and erase states due to characteristic deterioration of the 3-bit MLC non-volatile memory device.

In the MLC non-volatile memory device, e.g., the MLC flash memory device capable of storing k-bit data in a single memory cell, the memory cell may have one of $2^k$ threshold voltage distributions. For example, the 3-bit MLC has one of 8 threshold voltage distributions.

The threshold voltages of memory cells programmed for the same data form the threshold voltage distribution due to characteristic differences between memory cells. In the 3-bit MLC non-volatile memory device, as illustrated in FIG. 5, the threshold voltage distributions are formed in correspondence with the data states including 7 program states 'P1' to 'P7' and an erase state 'E'. FIG. 5 shows an ideal case in which the threshold voltage distributions do not overlap and have read voltage margins therebetween.

Referring to the flash memory example of FIG. 6, the memory cell may experience charge loss, which occurs when electrons trapped at a floating gate or tunnel oxide film are discharged over time. Such charge loss may accelerate when the tunnel oxide film deteriorates by iterative program and erase operations. The charge loss results in a decrease in the threshold voltages of memory cells. For example, as illustrated in FIG. 6, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 6.

Once neighbouring threshold voltage distributions overlap, read data may include a significant number of errors when a particular read voltage is applied to a selected word line. For example, when a sensed state of a memory cell according to a read voltage Vread3 is on, the memory cell is determined to have a second program state 'P2', When a sensed state of a memory cell according to a read voltage Vread3 is off, the memory cell is determined to have a third program state 'P3'. However, when neighbouring threshold voltage distributions overlap, the memory cell actually having the third program state 'P3' may be erroneously determined to have the second program state 'P2'. In short, when the neighbouring threshold voltage distributions overlap as illustrated in FIG. 6, read data may include a significant number of errors. Therefore, it is necessary to provide a scheme for precisely reading data stored in memory cells of a semiconductor memory device.

Figure 7:
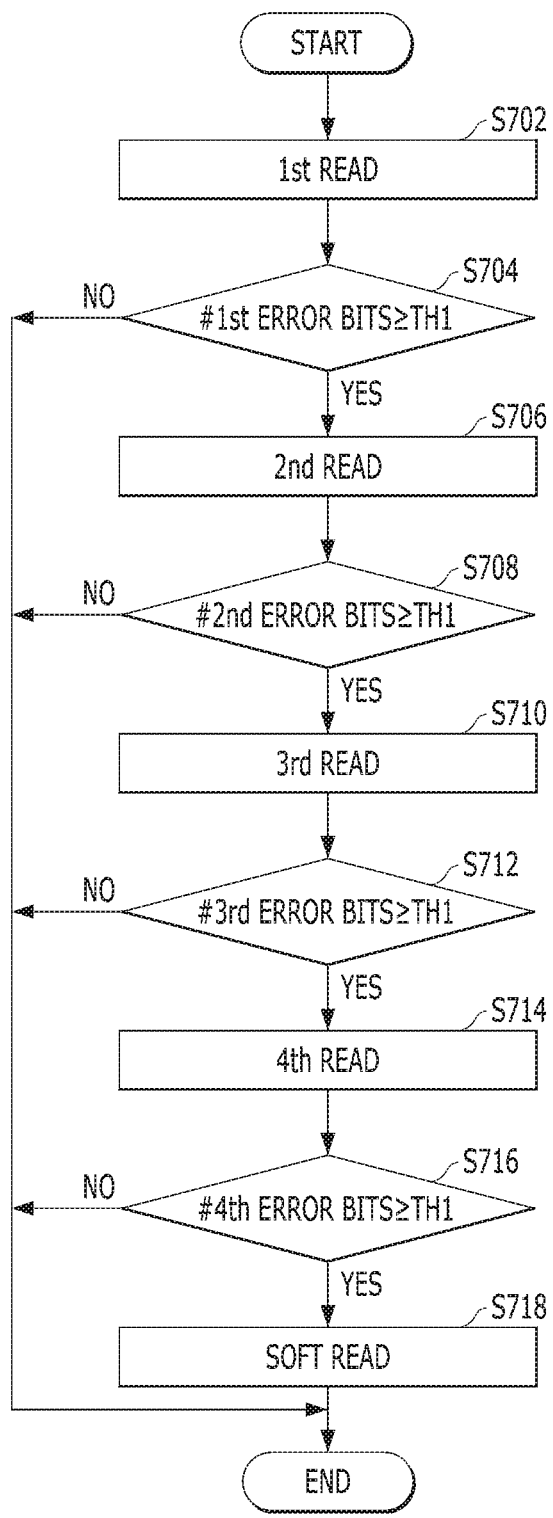
FIG. 7 is a flowchart illustrating a conventional process of correcting error bits included in read data.

FIG. 7 is a flowchart illustrating a conventional process of correcting error bits included in read data.

Referring to FIG. 7, at step S702, the controller 130 may control the memory device 150 to perform a first read operation $1^{st}$ READ. The controller 130 may control the memory device 150 to perform the first read operation $1^{st}$ READ in response to the read command. The first read operation $1^{st}$ READ may include reading request data corresponding to a read command provided from the host 102, in response to the read command. The controller 130 may control the memory device 150 to read the request data stored in a memory block based on a predetermined basic read voltage. The memory device 150 may provide the controller 130 with first data, which is read through the first read operation $1^{st}$ READ.

At step S704, the controller 130 may determine whether the first read operation $1^{st}$ READ succeeded. The controller 130 may measure the number of error bits #$1^{st}$ ERROR BITS included in the first data. When the number of error bits #$1^{st}$ ERROR BITS is greater than or equal to a first threshold value TH1, the controller 130 may process the first read operation $1^{st}$ READ as a 'fail'. When the number of error bits #$1^{st}$ ERROR BITS is less than the first threshold value TH1, the controller 130 may process the first read operation $1^{st}$ READ as a 'pass', and correct errors included in the first data and provide the corrected data to the host 102. In addition, the controller 130 may write the read voltage used for the first read operation $1^{st}$ READ to a read history table included in the memory 144 after processing the first read operation $1^{st}$ READ as the 'pass'. The controller 130 may also control the memory device 150 to store information on the read history table into a memory block of the memory device 150. The initial data stored in the read history table may be same as the predetermined basic read voltage used in the first read operation $1^{st}$ READ.

At step S706, the controller 130 may control the memory device 150 to perform a second read operation $2^{nd}$ READ. After processing the first read operation $1^{st}$ READ as the 'fail' (that is, "YES" at step S704), the controller 130 may control the memory device 150 to perform the second read operation $2^{nd}$ READ. The second read operation 2nd READ may include reading, as second data, the request data again based on the read voltage stored in the read history table. As described above, the controller 130 may update the read history table with the read voltage used for the first read operation $1^{st}$ READ whenever processing the first read operation $1^{st}$ READ as the 'pass'. The memory device 150 may provide the controller 130 with second data, which is read through the second read operation $2^{nd}$ READ.

At step S708, the controller 130 may determine whether the second read operation 2nd READ succeeded. The controller 130 may measure the number of error bits #$2^{nd}$ ERROR BITS included in the second data. When the number of error bits #$2^{nd}$ ERROR BITS is greater than or equal to the first threshold value TH1, the controller 130 may process the second read operation $2^{nd}$ READ as a 'fail'. When the number of error bits #$2^{nd}$ ERROR BITS is less than the first threshold value TH1, the controller 130 may process the second read operation 2nd READ as a 'pass', and correct errors included in the second data and provide the corrected data to the host 102.

After processing the second read operation $2^{nd}$ READ as the 'fail' (that is, "YES" at step S708), the controller 130 may control the memory device 150 to perform a third read operation $3^{rd}$ READ at step S710. The controller 130 may control the memory device 150 to perform the third read operation $3^{rd}$ READ. The third read operation $3^{rd}$ READ may include reading, as third data, the request data again by sequentially applying a plurality of read voltages included in a predetermined table according to experimental values. The third read operation $3^{rd}$ READ may include read operations corresponding to the respective read voltages included in the predetermined table. That is, the third read operation $3^{rd}$ READ may include one or more read operations. Accordingly, the time required for the third read operation $3^{rd}$ READ may be longer than that of the first read operation $1^{st}$ READ and the second read operation $2^{nd}$ READ.

At step S712, the controller 130 may determine whether the third read operation $3^{rd}$ READ succeeded. The controller 130 may measure the number of error bits #$3^{rd}$ ERROR BITS included in the third data. When the number of error bits #$3^{rd}$ ERROR BITS is greater than or equal to the first threshold value TH1, the controller 130 may process the third read operation $3^{rd}$ READ as a 'fail'. When the number of error bits #$3^{rd}$ ERROR BITS is less than the first threshold value TH1, the controller 130 may process the third read operation $3^{rd}$ READ as a 'pass', and correct errors included in the third data and provide the corrected data to the host 102.

After processing the third read operation $3^{rd}$ READ as the 'fail' (that is, "YES" at step S712), the controller 130 may control the memory device 150 to perform a fourth read operation $4^{th}$ READ at step S714. The controller 130 may perform an e-boost operation of detecting an optimal read voltage based on various algorithms. For example, the controller 130 may perform the e-boost operation by causing the read voltage to have an intermediate value between peak values of adjacent threshold voltage distributions according to the Gaussian modeling algorithm. In addition, the controller 130 may read specific data twice or more, and perform the e-boost operation based on the read result. The controller 130 may control the memory device 150 to perform the fourth read operation $4^{th}$ READ to read the request data again, as fourth data, by applying the optimal read voltage detected through the e-boost operation.

At step S716, the controller 130 may determine whether the fourth read operation $4^{th}$ READ succeeded. The controller 130 may measure the number of error bits #$4^{th}$ ERROR BITS included in the fourth data. When the number of error bits #$4^{th}$ ERROR BITS is greater than or equal to the first threshold value TH1, the controller 130 may process the fourth read operation $4^{th}$ READ as a 'fail'. When the number of error bits #$4^{th}$ ERROR BITS is less than the first threshold value TH1, the controller 130 may process the fourth read operation $4^{th}$ READ as a 'pass', and correct errors included in the fourth data and provide the corrected data to the host 102.

After processing the fourth read operation $4^{th}$ READ as the 'fail' (that is, "YES" at step S716), the controller 130 may correct the errors included in the fourth data, using a log likelihood ratio (LLR) generated with soft decision read voltages at step S718. The controller 130 may perform a soft read operation SOFT READ of reading data from the memory device 150 with the soft decision read voltages. The soft decision read voltages may have different levels from the optimal read voltage which is detected through the e-boost operation READ at step S714. For example, the controller 130 may additionally perform the soft read operation SOFT READ using the soft read voltages from the memory cells including the data read through the optimal read voltage. The soft read operation SOFT READ is not merely an operation of reading data but an operation of generating the LLR, using the soft decision read voltages. The LLR is information capable of adding reliability to the data read with the optimal read voltage detected through the e-boost operation. The controller 130 may correct the errors included in the fourth data, using the LLR, and provide the corrected data to the host 102.

According to the conventional art described above in reference with FIG. 7, when the number of error bits #$1^{st}$ ERROR BITS is greater than or equal to the first threshold value TH1, the controller 130 controls the memory device 150 to sequentially perform the second to fourth read operations $2^{nd}$ READ to $4^{th}$ READ and the soft read operation SOFT READ until the number of error bits included in the data read through each of the subsequent read operations for the request data becomes less than the first threshold value TH1. When the number of error bits included in each of the second and third data read through the second and third read operations $2^{nd}$ READ and $3^{rd}$ READ is still greater than or equal to the first threshold value TH1, and the number of error bits #$4^{th}$ ERROR BITS is less than the first threshold value TH1, or the errors included in the fourth data are corrected through the soft read operation, the time taken for the second and third read operations $2^{nd}$ READ and $3^{rd}$ READ out of the total time required for reading the request data may be unnecessary.

In accordance with an embodiment, after processing the first read operation $1^{st}$ READ as the 'fail', the controller 130 may determine whether to perform the second and third read operations 2nd READ and $3^{rd}$ READ according to the number of error bits #$1^{st}$ ERROR BITS. When it is determined that the errors included in the request data are correctable only when the fourth read operation $4^{th}$ READ and the soft read operation SOFT READ have to be performed, based on the number of error bits #$1^{st}$ ERROR BITS, the controller 130 may control the memory device 150 to skip the second and third read operations 2nd READ and $3^{rd}$ READ and immediately perform the fourth read operation $4^{th}$ READ and the soft read operation SOFT READ after performing the first read operation $1^{st}$ READ, thereby shortening the total time required for successfully reading the request data.

Figure 8:
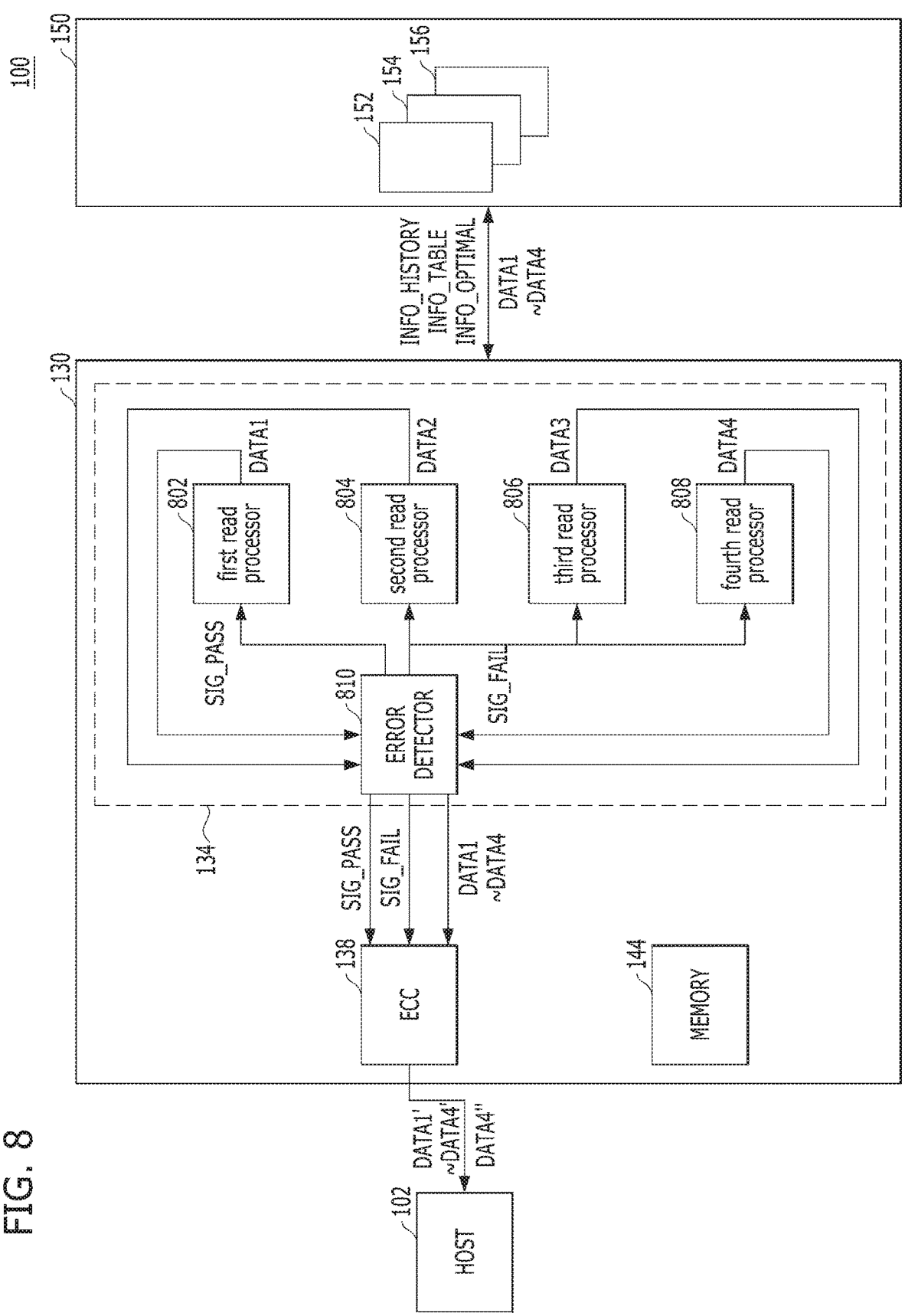
FIG. 8 is a diagram illustrating a data processing system including a controller in accordance with an embodiment.

FIG. 8 is a diagram illustrating a data processing system 100 in accordance with an embodiment. FIG. 8 illustrates a configuration related to embodiments of the present invention, among the configurations of the data processing system 100 shown in FIG. 1.

Referring to FIG. 8, the data processing system 100 may include a host 102 and a memory system 100 including a controller 130 and a memory device 150. The controller 130 may include a processor 134, an error correction code (ECC) circuit 138 and a memory 144. The processor 134 may include a first read processor 802, a second read processor 804, a third read processor 806, a fourth read processor 808 and an error detector 810.

The first read processor 802 may control the memory device 150 to perform a first read operation. In response to a read command received from a host 102, the first read processor 802 may control the memory device 150 to perform the first read operation. The first read operation may include reading request data corresponding to the read command. The first read processor 802 may control the memory device 150 to read, as first data DATA1, the request data stored in a memory block of the memory device 150 based on a predetermined basic read voltage. The first read processor 802 may provide the first data DATA1 to the error detector 810. As will be described below, when the error detector 810 processes the first read operation as a 'pass', the first read processor 802 may store a read voltage V_PASS used for the first read operation in a read history table, which may be included in the memory 144.

The error detector 810 may measure the number of first error bits included in the first data DATA1 to determine whether the first read operation succeeded. When the number of first error bits is less than a first threshold value TH1, the error detector 810 may process the first read operation as the 'pass', and provide a pass signal SIG_PASS and the first data DATA1 to an ECC circuit 138. As will be described below, the ECC circuit 138 may correct errors included in the first data DATA1, and provide the corrected first data DATA1' to the host 102. In addition, the error detector 810 may provide the pass signal SIG_PASS to the first read processor 802 after processing the first read operation as the 'pass'. In response to the pass signal SIG_PASS, the first read processor 802 may store the read voltage V_PASS in the read history table of the memory 144. The first read processor 802 may control the memory device 150 to program information INFO_HISTORY on the read history table into the memory block.

When the number of first error bits is greater than or equal to the first threshold value TH1 and less than a second threshold value TH2, the error detector 810 may process the first read operation as a 'fail', and provide a fail signal SIG_FAIL to the second read processor 804. When the number of first error bits is greater than or equal to the second threshold value TH2, the error detector 810 may process the first read operation as the 'fail', and provide the fail signal SIG_FAIL to the fourth read processor 808. In accordance with the present embodiment, the error detector 810 may not unconditionally provide the fail signal SIG_FAIL to the second read processor 804 after processing the first read operation as the 'fail', and provide the fail signal SIG_FAIL to the fourth read processor 808 when the number of first error bits is greater than or equal to the second threshold value TH2. When it is predicted that second and third read operations are to be processed as the 'fail', based on the number of first error bits, the error detector 810 may control the memory device 150 to skip the second and third read operations and immediately perform a fourth read operation and a soft read operation, thereby shortening the total time required for successfully reading the request data.

The second read processor 804 may control the memory device 150 to perform the second read operation in response to the fail signal SIG_FAIL. The second read processor 804 may control the memory device 150 to perform the second read operation based on the information INFO_HISTORY. The second read operation may include reading, as second data DATA2, the request data corresponding to the read command from the host 102 again. The information INFO_HISTORY may be information on the read voltage stored in the read history table of the memory 144. As described above, the first read processor 802 may update the read voltage V_PASS used for the first read operation into the read history table whenever the first read operation is processed as the 'pass'. The second read processor 804 may provide the second data DATA2 to the error detector 810.

The error detector 810 may measure the number of second error bits included in the second data DATA2 to determine whether the second read operation succeeded. When the number of second error bits is greater than or equal to the first threshold value TH1, the error detector 810 may process the second read operation as the 'fail', and provide the fail signal SIG_FAIL to the third read processor 806. When the measured number of second error bits is less than the first threshold value TH1, the error detector 810 may process the second read operation as the 'pass', and provide the pass signal SIG_PASS and the second data DATA2 to the ECC circuit 138. As will be described below, the ECC circuit 138 may correct errors included in the second data DATA2, and provide corrected second data DATA2' to the host 102.

The third read processor 806 may control the memory device 150 to perform the third read operation in response to the fail signal SIG_FAIL. The third read processor 806 may control the memory device 150 to perform the third read operation based on information INFO_TABLE. The third read operation may include reading, as third data DATA3, the request data corresponding to the read command from the host 102 again. The information INFO_TABLE may be information on a plurality of read voltages stored in a predetermined table according to an experimental value, which is stored in the memory 144. The read history table used in the second read operation may be updated whenever the first read operation is processed as 'pass', whereas the predetermined table may include fixed voltages, which are determined based on experimental value at the manufacturing process. The third read operation may include read operations corresponding to the respective read voltages included in the predetermined table. In other words, the third read operation may include one or more read operations. Accordingly, the time required for the third read operation may be longer than that of the first read operation and the second read operation. The third read processor 806 may provide the third data DATA3 to the error detector 810.

The error detector 810 may measure the number of third error bits included in the third data DATA3 to determine whether the third read operation succeeded. When the number of third error bits is greater than or equal to the first threshold value TH1, the error detector 810 may process the third read operation as the 'fail', and provide the fail signal SIG_FAIL to the fourth read processor 808. When the number of third error bits is less than the first threshold value TH1, the error detector 810 may process the third read operation as the 'pass', and provide the pass signal SIG_PASS and the third data DATA3 to the ECC circuit 138. As will be described below, the ECC circuit 138 may correct errors included in the third data DATA3, and provide the corrected third data DATA3' to the host 102.

The fourth read processor 808 may control the memory device 150 to perform the fourth read operation in response to the fail signal SIG_FAIL. The fourth read processor 808 may perform an e-boost operation of detecting an optimal read voltage V_OPTIMAL based on various algorithms. For example, the fourth read processor 808 may perform the e-boost operation by causing the read voltage to have an intermediate value between peak values of adjacent threshold voltage distributions according to the Gaussian modeling algorithm. In addition, the fourth read processor 808 may read specific data twice or more, and perform the e-boost operation based on the read result. The fourth read processor 808 may control the memory device 150 to perform the fourth read operation. The fourth read operation may include reading, as fourth data DATA4, request data corresponding to the read command provided from the host 102 again based on the optimal read voltage V_OPTIMAL. The fourth read processor 808 may provide the fourth data DATA4 to the error detector 810.

The error detector 810 may measure the number of fourth error bits included in the fourth data DATA4 to determine whether the fourth read operation succeeded. When the number of fourth error bits is greater than or equal to the first threshold value TH1, the error detector 810 may process the fourth read operation as the 'fail', and provide the fail signal SIG_FAIL and the fourth data DATA4 to the ECC circuit 138. When the number of fourth error bits is less than the first threshold value TH1, the error detector 810 may process the fourth read operation as the 'pass', and provide the pass signal SIG_PASS and the fourth data DATA4 to the ECC circuit 138.

The ECC circuit 138 may correct errors included in the fourth data DATA4 using a log likelihood ratio (LLR) generated through soft decision read voltages, in response to the fail signal SIG_FAIL. The ECC circuit 138 may control the memory device 150 to read data with the soft decision read voltages. The soft decision read voltages may have different levels from the optimal read voltage V_OPTIMAL. For example, the ECC circuit 138 may control the memory device 150 to additionally perform the soft read operation using the soft read voltages, from memory cells including the fourth data DATA4 read through the optimal read voltage V_OPTIMAL. The soft read operation is not merely an operation of reading data but an operation of generating the LLR, which is information capable of adding reliability to the data read with the optimal read voltage V_OPTIMAL, using the soft decision read voltages. The ECC circuit 138 may correct the errors included in the fourth data using the LLR, and provide the corrected fourth data DATA4" to the host 102.

The ECC circuit 138 may correct the errors included in the first to fourth data DATA1 to DATA4 in response to the pass signal SIG_PASS. The ECC circuit 138 may perform an error correction decoding operation on the first to fourth data DATA1 to DATA4 which are read under the control of the first to fourth read processors 802 to 808, respectively, using an error correction code. The ECC circuit 138 may correct the errors included in the first to fourth data DATA1 to DATA4, and provide the corrected first to fourth data DATA1' to DATA4' to the host 102.

Figure 9:
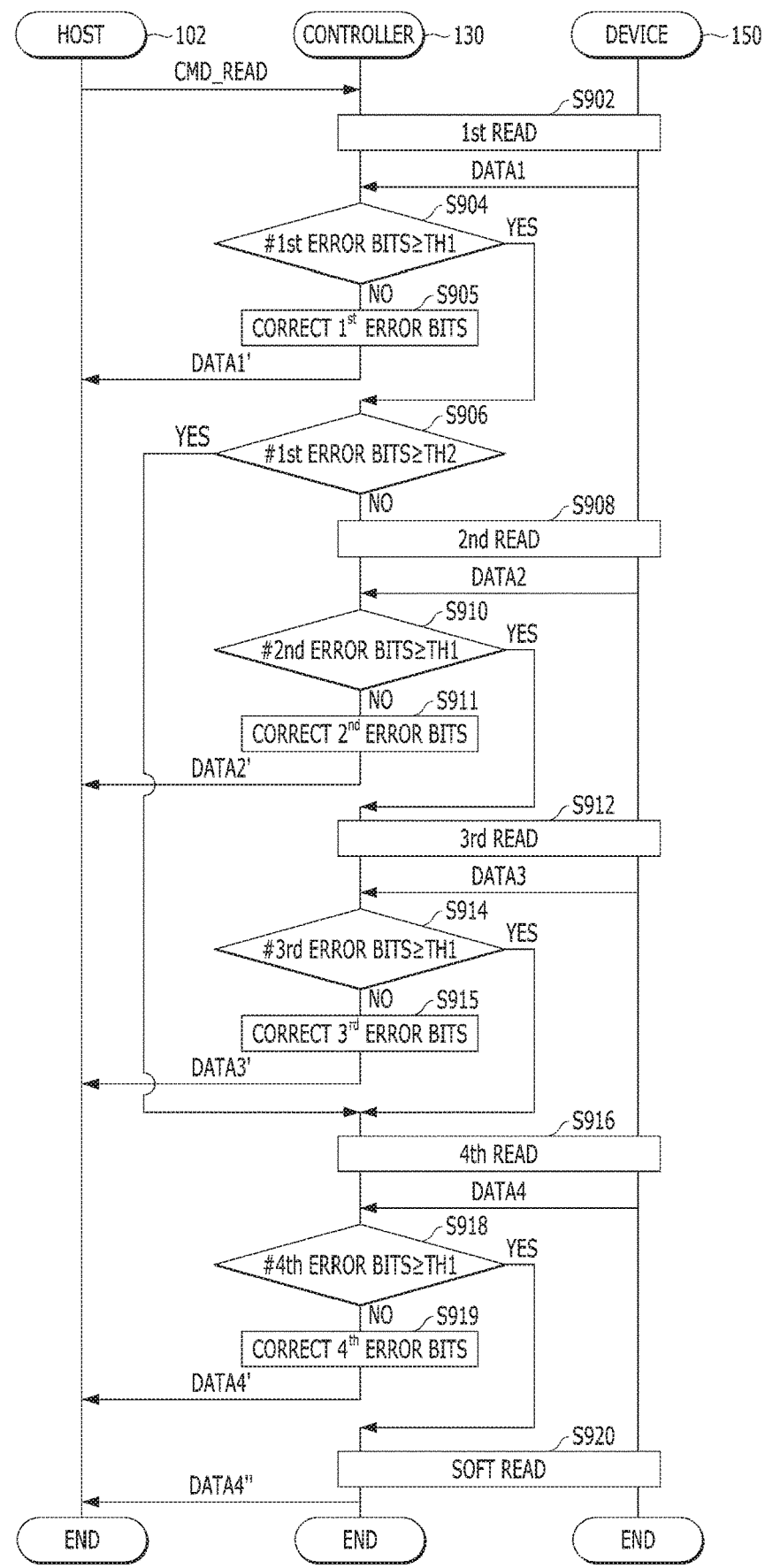
FIG. 9 is a flowchart illustrating an operating process of a data processing system in accordance with an embodiment.

FIG. 9 is a flowchart illustrating an operating process of a data processing system 100 in accordance with an embodiment. For example, the process of FIG. 9 may be performed by the controller 130 of FIG. 8.

Referring to FIG. 9, at step S902, the controller 130 may control the memory device 150 to perform a first read operation $1^{st}$ READ in response to a read command CMD_READ received from the host 102. The controller 130 may control the memory device 150 to perform the first read operation $1^{st}$ READ. The first read operation $1^{st}$ READ may include reading, as first data DATA1, data corresponding to the read command CMD_READ using a predetermined basic read voltage. The memory device 150 may provide the controller 130 with the first data DATA1.

At step S905, when the number of error bits $\#1^{st}$ ERROR BITS included in the first data DATA1 is less than a first threshold value TH1 (that is, "NO" at step S904), the controller 130 may correct errors included in the first data DATA1. After correcting the errors included in the first data DATA1, the controller 130 may provide the corrected first data DATA1' to the host 102. For example, when the first threshold value TH1 is 20 and the number of error bits $\#1^{st}$ ERROR BITS is 15, the controller 130 may correct the errors included in the first data DATA1, and provide the corrected first data DATA1' to the host 102.

When the number of error bits $\#1^{st}$ ERROR BITS is greater than or equal to the first threshold value TH1 (that is, "YES" at step S904), the controller 130 may compare the number of error bits $\#1^{st}$ ERROR BITS with a second threshold value TH2 at step S906. When the number of error bits $\#1^{st}$ ERROR BITS is greater than or equal to the first threshold value TH1 and less than the second threshold TH2 (that is, "NO" at step S906), the controller 130 may control the memory device 150 to perform a second read operation $2^{nd}$ READ. When the number of error bits $\#1^{st}$ ERROR BITS is greater than or equal to the second threshold value TH2 (that is, "YES" at step S906), then at step S916, the controller 130 may control the memory device 150 to perform a fourth read operation $4^{th}$ READ. For example, when the first threshold value TH1 is 20, the second threshold value TH2 is 50, and the number of error bits $\#1^{st}$ ERROR BITS is 45, the controller 130 may control the memory device 150 to perform the second read operation $2^{nd}$ READ. When the first threshold value TH1 is 20, the second threshold value TH2 is 50, and the number of error bits $\#1^{st}$ ERROR BITS is 55, the controller 130 may control the memory device 150 to perform the fourth read operation $4^{th}$ READ.

Furthermore, when the number of error bits $\#1^{st}$ ERROR BITS is greater than or equal to the first threshold value TH1, the controller 130 may not unconditionally perform the second read operation $2^{nd}$ READ. That is, when the number of error bits $\#1^{st}$ ERROR BITS is greater than or equal to the second threshold value TH2, the controller 130 may control the memory device 150 to skip the second read operation $2^{nd}$ READ and a third read operation $3^{rd}$ READ and immediately perform the fourth read operation $4^{th}$ READ, thereby shortening the total time required for the read operations on request data corresponding to the read command CMD_READ provided from the host 102.

When the number of error bits $\#1^{st}$ ERROR BITS is greater than or equal to the first threshold value TH1 and less than the second threshold value TH2 (that is, "NO" at step S906), the controller 130 may control the memory device 150 to perform the second read operation $2^{nd}$ READ at step S908. The controller 130 may control the memory device 150 to perform the second read operation $2^{nd}$ READ. The second read operation $2^{nd}$ READ may include reading, as second data DATA2, the data corresponding to the read command CMD_READ provided from the host 102 again using a read voltage stored in a read history table. As described above, the read history table may include the read voltage used when the data corresponding to the read command CMD_READ provided from the host 102 is successfully read through the first read operation $1^{st}$ READ. The memory device 150 may provide the controller 130 with the second data DATA2.

At step S911, when the number of error bits $\#2^{nd}$ ERROR BITS included in the second data DATA2 is less than the first threshold value TH1 (that is, "NO" at step S910), the controller 130 may correct errors included in the second data DATA2. After correcting the errors included in the second data DATA2, the controller 130 may provide the corrected second data DATA2' to the host 102. For example, when the first threshold value TH1 is 20 and the number of error bits $\#2^{nd}$ ERROR BITS is 15, the controller 130 may correct the errors included in the second data DATA2, and then provide the corrected second data DATA2' to the host 102.

When the number of error bits $\#2^{nd}$ ERROR BITS is greater than or equal to the first threshold value TH1 (that is, "YES" at step S910), the controller 130 may control the memory device 150 to perform the third read operation $3^{rd}$ READ at step S912. The third read operation $3^{rd}$ READ may include reading, as third data DATA3, the data corresponding to the read command CMD_READ provided from the host 102 again using read voltages included in a predetermined table according to experimental values. The predetermined table may include a plurality of read voltages. The controller 130 may control the memory device 150 to perform the third read operation $3^{rd}$ READ by sequentially applying the plurality of read voltages. For example, when the first threshold value TH1 is 20 and the number of error bits $\#2^{nd}$ ERROR BITS is 35, the controller 130 may control the memory device 150 to perform the third read operation $3^{rd}$ READ. The memory device 150 may provide the controller 130 with the third data DATA3.

At step S915, when the number of error bits $\#3^{rd}$ ERROR BITS included in the third data DATA3 is less than the first threshold value TH1 (that is, "NO" at step S914), the controller 130 may correct errors included in the third data DATA3. After correcting the errors included in the third data DATA3, the controller 130 may provide the corrected third data DATA3' to the host 102. For example, when the first threshold value TH1 is 20 and the number of error bits $\#3^{rd}$ ERROR BITS is 10, the controller 130 may correct the errors included in the third data DATA3, and then provide the corrected third data DATA3' to the host 102.

When the number of error bits $\#1^{st}$ ERROR BITS is greater than or equal to the second threshold value TH2 (that is, "YES" at step S906), or the number of error bits $\#3^{rd}$ ERROR BITS is greater than or equal to the first threshold value TH1 (that is, "YES" at step S914), the controller 130 may control the memory device 150 to perform the fourth read operation $4^{th}$ READ at step S916. The controller 130 may perform an e-boost operation to detect an optimal read voltage, and control the memory device 150 to perform the fourth read operation $4^{th}$ READ. The fourth read operation $4^{th}$ READ may include reading, as fourth data DATA4, the data corresponding to the read command CMD_READ provided from the host 102 again using the optimal read voltage. For example, when the first threshold value TH1 is 20 and the number of error bits $\#3^{rd}$ ERROR BITS is 30, the controller 130 may control the memory device 150 to perform the fourth read operation 4th READ. The memory device 150 may provide the controller 130 with the fourth data DATA4.

At step S919, when the number of error bits $\#4^{th}$ ERROR BITS included in the fourth data DATA4 is less than the first threshold value TH1 (that is, "NO" at step S918), the controller 130 may correct errors included in the fourth data DATA4. After correcting the errors included in the fourth data DATA4, the controller 130 may provide the corrected fourth data DATA4' to the host 102. For example, when the first threshold value TH1 is 20 and the number of error bits $\#4^{th}$ ERROR BITS is 2, the controller 130 may correct the errors included in the fourth data DATA4, and then provide the corrected fourth data DATA4' to the host 102.

When the number of error bits $\#4^{th}$ ERROR BITS included in the fourth data DATA4 is greater than or equal to the first threshold value TH1 (that is, "YES" at step S918), the controller 130 may control the memory device 150 to perform a soft read operation SOFT READ at step S920. The controller 130 may perform the soft read operation SOFT READ. The soft read operation SOFT READ may include reading data from the memory device 150 using soft decision read voltages having different levels from the optimal read voltage which is detected through the e-boost operation READ at step S916. For example, when the first threshold value TH1 is 20 and the number of error bits $\#4^{th}$ ERROR BITS is 22, the controller 130 may correct the errors included in the fourth data DATA4 using an LLR generated through the soft read operation SOFT READ. As described above, the soft read operation SOFT READ is not merely an operation of reading data but an operation of generating the LLR. The LLR is information capable of adding reliability to the data read with the optimal read voltage detected through the e-boost operation, using the soft decision read voltages. The controller 130 may correct the errors included in the fourth data DATA4 read at step S916, using the LLR generated at step S920, and then provide the corrected fourth data DATA4" to the host 102.

Hereinafter, a data processing system and electronic devices to which the memory system 110 including the memory device 150 and controller 130 described above with reference to FIGS. 1 to 9 is applied will now be described in more detail with reference to FIGS. 10 to 18.

Figure 10:
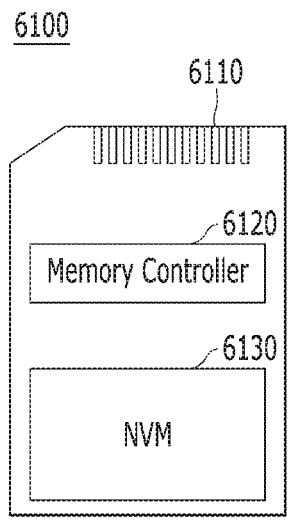
FIGS. 10 to 18 are diagrams schematically illustrating exemplary applications of a data processing system in accordance with various embodiments of the present invention.

FIG. 10 is a diagram illustrating another example of a data processing system including a memory system in accordance with an embodiment. For example, FIG. 10 illustrates a memory card system 6100 to which the memory system may be applied.

Referring to FIG. 10, the memory card system 6100 may include a memory controller 6120, a memory device 6130 and a connector 6110.

More specifically, the memory controller 6120 may be electrically connected to, and configured to access, the memory device 6130 embodied by a nonvolatile memory. For example, the memory controller 6120 may be configured to control read, write, erase and background operations of the memory device 6130. The memory controller 6120 may be configured to provide an interface between the memory device 6130 and an external device (e.g., the host 102 of FIG. 1), and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processor, a host interface, a memory interface and an error correction component.

The memory controller 6120 may communicate with the external device through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with the present embodiment may be applied to wired/wireless electronic devices and specific mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state drive (SSD). Also, the memory controller 6120 and the memory device 6130 may be so integrated to form a memory card such as a PC card (e.g., a Personal Computer Memory Card International Association (PCM-CIA) card), a compact flash (CF) card, a smart media card (e.g., a SM and a SMC), a memory stick, a multimedia card (e.g., a MMC, a RS-MMC, a MMCmicro and an eMMC), a secure digital (SD) card (e.g., a SD, a miniSD, a microSD and a SDHC), and/or a universal flash storage (UFS).

Figure 11:
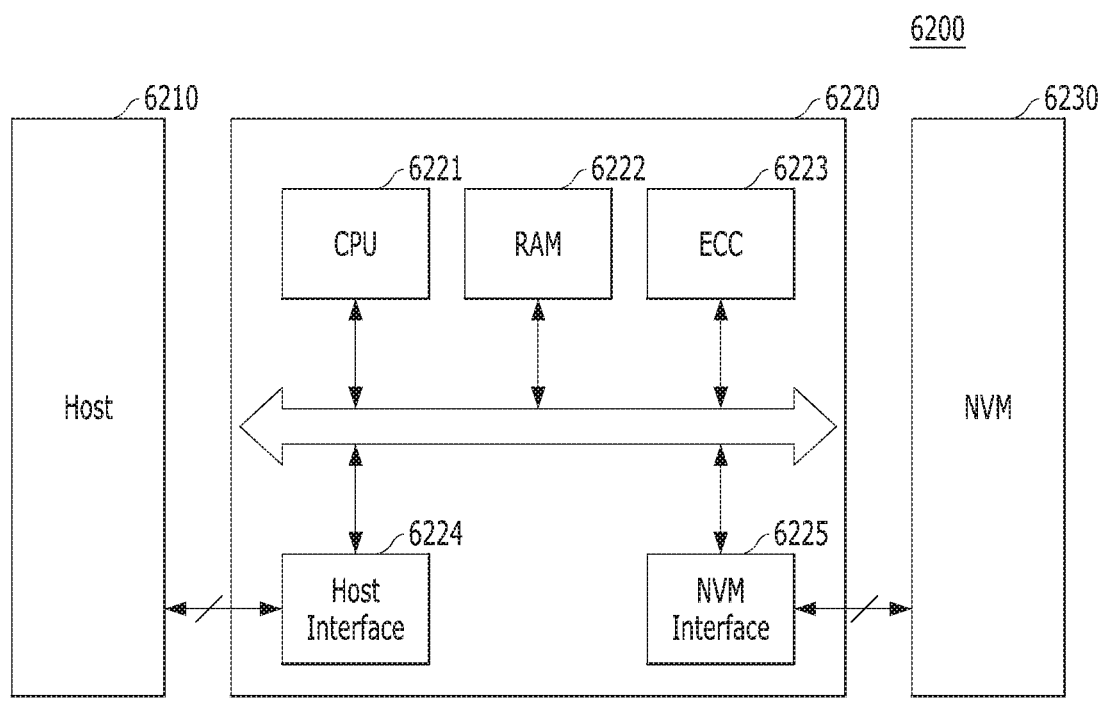

FIG. 11 is a diagram illustrating another example of a data processing system 6200 including a memory system in accordance with an embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more central processing units (CPUs) 6221, a buffer memory such as a random access memory (RAM) 6222, an error correction code (ECC) circuit 6223, a host interface 6224 and a memory interface such as a nonvolatile memory (NVM) interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may generate an error correction code (ECC) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the low density parity check (LDPC) code, Bose-Chaudhri-Hocquenghem (BCH) code, turbo code, Reed-Solomon (RS) code, convolution code, recursive systematic code (RSC) or coded modulation such as trellis coded modulation (TCM) or block coded modulation (BCM).

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 through a parallel advanced technology attachment (DATA) bus, a serial advanced technology attachment (SATA) bus, a small computer system interface (SCSI), a universal serial bus (USB), a peripheral component interconnect-express (PCIe) or a NAND interface. The memory controller 6220 may have a wireless communication function with a mobile communication protocol such as wireless fidelity (WiFi) or long term evolution (LTE). The memory controller 6220 may be connected to an external device, for example, the host 6210 or another external device, and then transmit/receive data to/from the external device. In particular, as the memory controller 6220 is configured to communicate with the external device according to one or more of various communication protocols, the memory system and the data processing system in accordance with an embodiment may be applied to wired/wireless electronic devices, particularly a mobile electronic device.

Figure 12:
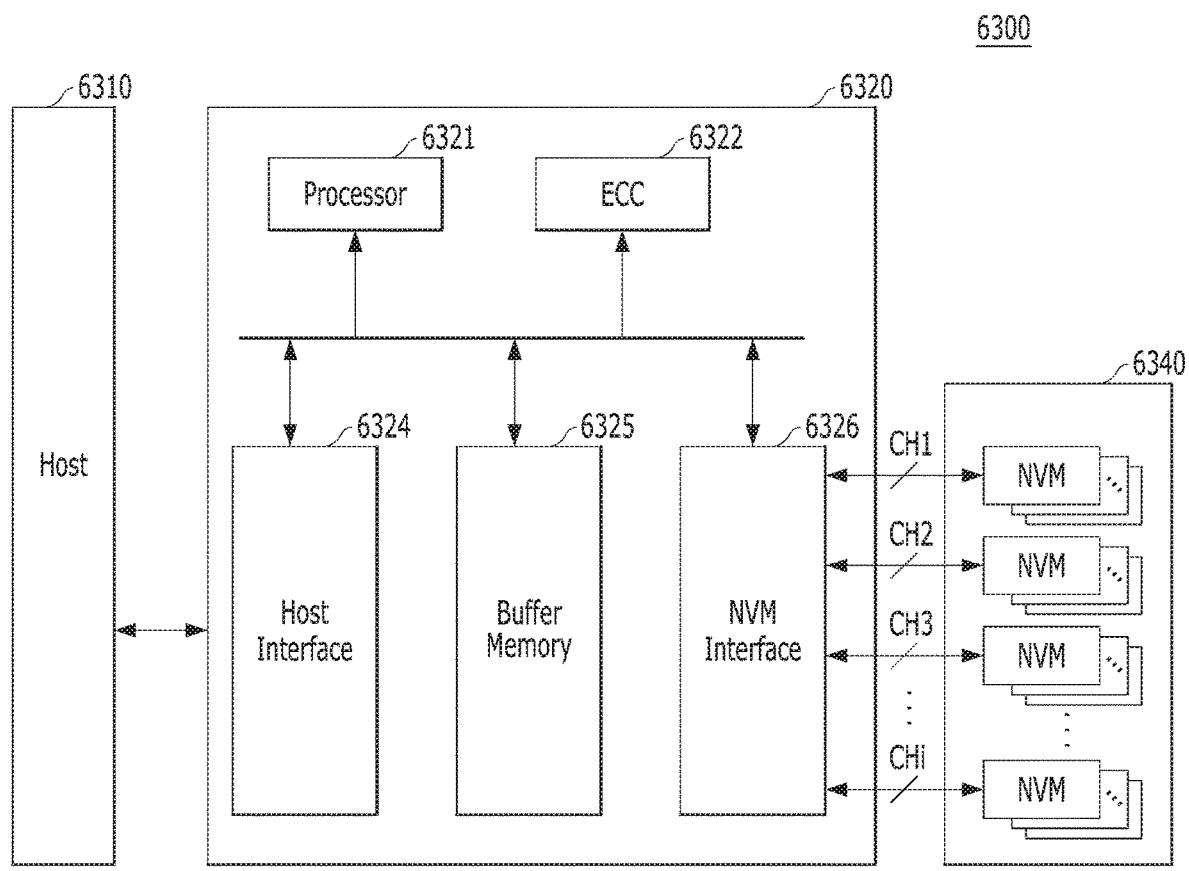

FIG. 12 is a diagram illustrating another example of a data processing system including the memory system in accordance with an embodiment. For example, FIG. 12 illustrates a solid state drive (SSD) 6300 to which the memory system may be applied.

Referring to FIG. 12, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

Specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of nonvolatile memories (e.g., flash memories) (NVMs) included in the memory device 6340. Further, the buffer memory 6325 may temporarily store meta data of the plurality of flash memories, for example, map data including a mapping table. The buffer memory 6325 may be embodied by any of a variety of volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). FIG. 12 illustrates that the buffer memory 6325 is embodied in the controller 6320. However, the buffer memory 6325 may be external to the controller 6320.

The ECC circuit 6322 may calculate an error correction code (ECC) value of data to be programmed to the memory device 6340 during a program operation. The ECC circuit 6322 may perform an error correction operation on data read from the memory device 6340 based on the ECC value during a read operation. The ECC circuit 6322 may perform an error correction operation on data recovered from the memory device 6340 during a failed data recovery operation.

The host interface 6324 may provide an interface function with an external device, for example, the host 6310. The nonvolatile memory interface 6326 may provide an interface function with the memory device 6340 connected through the plurality of channels.

Furthermore, a plurality of SSDs 6300 to which the memory system 110 of FIG. 1 may be applied, may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
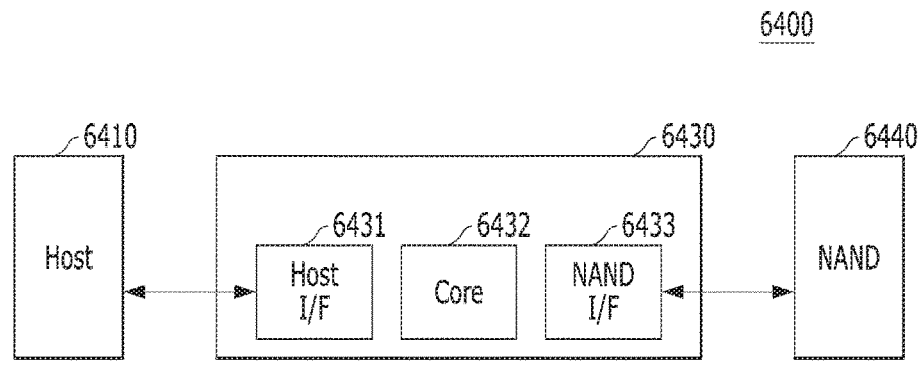

FIG. 13 is a diagram illustrating another example of a data processing system including the memory system in accordance with an embodiment. For example, FIG. 13 illustrates an embedded multi-media card (eMMC) 6400 to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

Specifically, the controller 6430 may be connected to the memory device 6440 through a plurality of channels. The controller 6430 may include a host interface 6431, one or more cores 6432 and a memory interface, for example, a NAND interface 6433.

The core 6432 may control overall operations of the eMMC 6400. The host interface 6431 may provide an interface function between the controller 6430 and the host 6410. The NAND interface 6433 may provide an interface function between the memory device 6440 and the controller 6430. For example, the host interface 6431 may serve as a parallel interface, for example, a MMC interface as described with reference to FIG. 1. Furthermore, the host interface 6431 may serve as a serial interface, for example, ultra high speed (UHS)-I/UHS-II interface.

FIGS. 14 to 17 are diagrams illustrating other examples of a data processing system including a memory system in accordance with embodiments. For example, FIGS. 14 to 17 illustrate universal flash storage (UFS) systems 6500, 6600, 6700, 6800, to which the memory system may be applied.

Referring to FIGS. 14 to 17, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices, particularly mobile electronic devices. The UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices, particularly mobile electronic devices through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 11 to 13. The UFS cards 6530, 6630, 6730, 6830 may be embodied in the form of the memory card system 6100 described with reference to FIG. 10.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in Mobile Industry Processor Interface (MIPI). Furthermore, the UFS devices 6520, 6620, 6720, 6820 and the UFS cards 6530, 6630, 6730, 6830 may communicate with each other through any of various protocols other than the UFS protocol, for example, universal storage bus (USB) Flash Drives (UFDs), a multi-media card (MMC), a secure digital (SD), a mini-SD, and a micro-SD.

Figure 14:
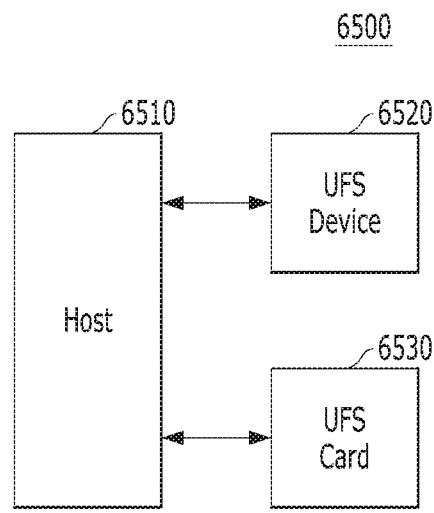

In the UFS system 6500 illustrated in FIG. 14, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 15:
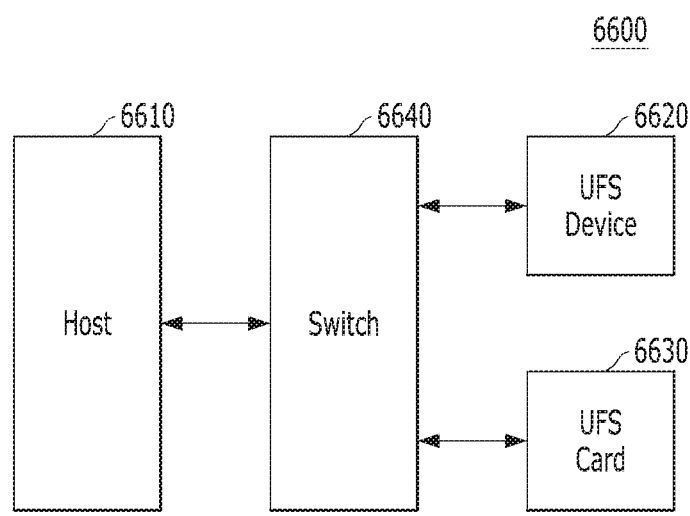

In the UFS system 6600 illustrated in FIG. 15, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 16:
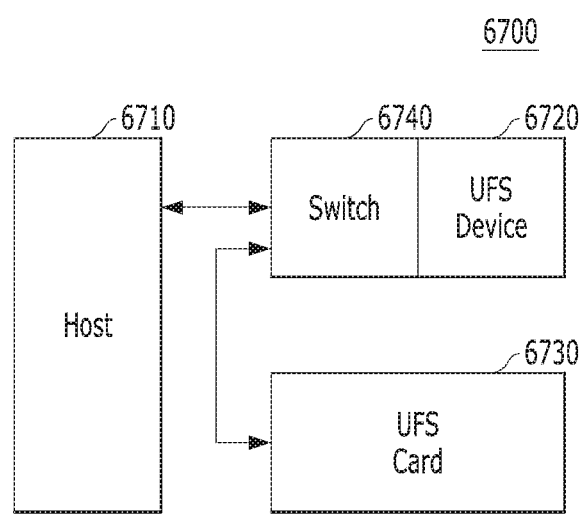

In the UFS system 6700 illustrated in FIG. 16, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 17:
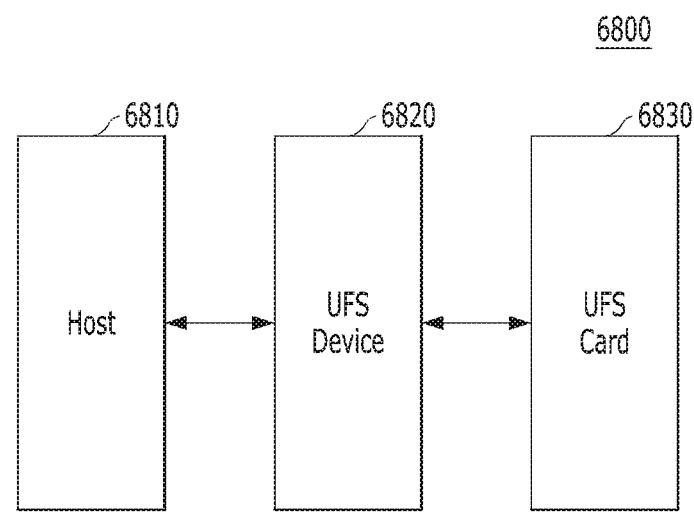

In the UFS system 6800 illustrated in FIG. 17, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 18:
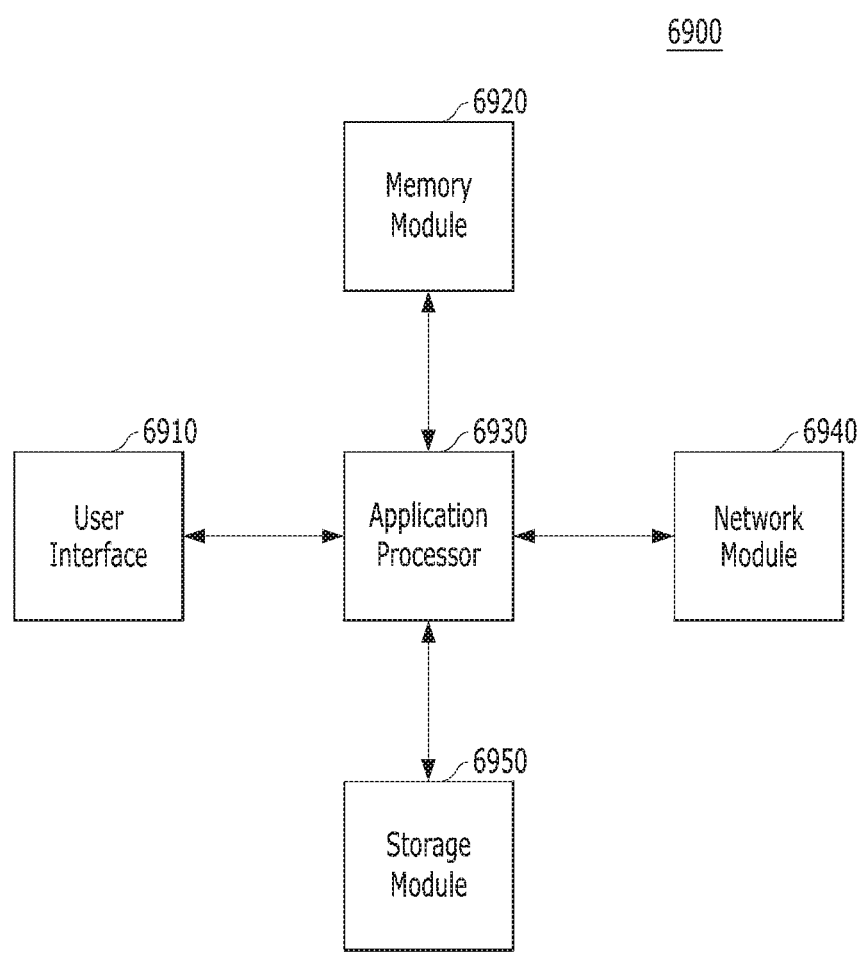

FIG. 18 is a diagram illustrating another example of a data processing system including the memory system in accordance with an embodiment of the present invention. For example, FIG. 18 is a diagram illustrating a user system 6900 to which the memory system may be applied.

Referring to FIG. 18, the user system 6900 may include a user interface 6910, a memory module 6920, an application processor 6930, a network module 6940 and a storage module 6950.

Specifically, the application processor 6930 may drive components in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, a DDR2 SDRAM, a DDR3 SDRAM, a low power DDR (LPDDR) SDARM, a LPDDR3 SDRAM or a LPDDR4 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on package on package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

In accordance with the present embodiments, the memory system may improve the read speed by skipping a read retry operation when the number of error bits included in read data is greater than or equal to the predetermined threshold value.

While the present invention has been described with respect to the specific embodiments, it will be apparent to those skilled in the art that various changes and modifications may be made without departing from the spirit and scope of the invention as defined in the following claims.

What is claimed is:

1. A memory system comprising:
a memory device; and
a controller configured to control the memory device to perform a read operation on request data in response to a read command from a host, receive the request data corresponding to the read operation from the memory device, correct error of the request data to generate corrected data and provide the corrected data to the host,
wherein the controller includes:
a first read processor configured to perform a first read operation of reading, as first data, the request data in response to the read command;
a second read processor configured to perform a second read operation of reading, as second data, the request data again using a voltage stored in a read history table, when the number of error bits of the first data is greater than or equal to a first threshold value and less than a second threshold value;
a third read processor configured to perform a third read operation of reading, as third data, the request data again using voltages stored in a predetermined table, when the number of error bits of the second data is equal to or greater than the first threshold value; and
a fourth read processor configured to detect a read voltage and perform a fourth read operation of reading, as fourth data, the request data again using the read voltage, when the number of error bits of the third data is equal to or greater than the first threshold value,
wherein the fourth read processor performs the fourth read operation when the number of error bits of the first data is greater than or equal to the second threshold value.

2. The memory system of claim 1, wherein the controller further includes an error correction code (ECC) circuit configured to perform a soft read operation of generating a log likelihood ratio (LLR) using soft read voltages when the number of error bits of the fourth data is greater than or equal to the first threshold value.

3. The memory system of claim 1, wherein the controller further comprises a memory configured to store the read history table and the predetermined table.

4. The memory system of claim 2, wherein the controller further comprises an error detector configured to detect errors of the first to fourth data and compare the number of error bits of each of the first to fourth data with the first and second threshold values.

5. The memory system of claim 1, wherein the first read processor performs the first read operation using a predetermined basic read voltage.

6. The memory system of claim 1, wherein the first read processor updates the read history table with the read voltage used for the first read operation whenever the first read operation is processed as a 'pass'.

7. The memory system of claim 1, wherein the fourth read processor detects the read voltage through an e-boost operation, wherein the e-boost operation comprises an operation of detecting the read voltage according to the Gaussian modeling algorithm or an operation of detecting the read voltage based on a result obtained by performing two or more read operations.

8. The memory system of claim 2, wherein the LLR includes information capable of adding reliability to the fourth data.

9. The memory system of claim 2, wherein the ECC circuit corrects the errors of the first to fourth data and provides the corrected data to the host when the number of error bits of each of the first to fourth data is less than the first threshold value.

10. The memory system of claim 3, wherein the memory incudes a volatile memory.

11. An operating method of a memory system comprising:
a first read step of reading, as first data, request data in response to a read command provided from a host;
a second read step of reading, as second data, the request data again using a voltage stored in a read history table, when the number of error bits of the first data is greater than or equal to a first threshold value and less than a second threshold value;
a third read step of reading, as third data, the request data again using voltages stored in a predetermined table, when the number of error bits of the second data is greater than or equal to the first threshold value; and
a fourth read step of detecting a read voltage and reading, as fourth data, the request data again using the read voltage, when the number of error bits of the third data is greater than or equal to the first threshold value,
wherein the fourth read step is performed when the number of error bits of the first data is greater than or equal to the second threshold value.

12. The operating method of claim 11, further comprising an error correction code (ECC) performing step of performing a soft read operation of generating a log likelihood ratio (LLR) using soft read voltages, when the number of error bits of the fourth data is greater than or equal to the first threshold value.

13. The operating method of claim 11, further comprising storing the read history table and the predetermined table in a memory.

14. The operating method of claim 12, further comprising an error detection step of detecting errors of the first to fourth data and comparing the number of error bits of each of the first to fourth data with the first and second threshold values.

15. The operating method of claim 11, wherein the first read step comprises reading the request data using a predetermined basic read voltage.

16. The operating method of claim 11, wherein the first read step comprises updating the read history table with the read voltage used for the first read step, when the number of error bits of the first data is less than the first threshold value.

17. The operating method of claim 11, wherein the fourth read step comprises detecting the read voltage through an e-boost operation, wherein the e-boost operation comprises detecting the read voltage according to the Gaussian modeling algorithm or detecting the read voltage based on a result obtained by performing two or more read operations.

18. The operating method of claim 12, wherein the LLR includes information capable of adding reliability to the fourth data.

19. The operating method of claim 12, wherein the ECC performing step comprises correcting the errors of the first to fourth data and providing the corrected data to the host, when the number of error bits of each of the first to fourth data is less than the first threshold value.

20. The operating method of claim 13, wherein the memory includes a volatile memory.

\* \* \* \* \*